United States Patent [19]
Gaines et al.

[11] Patent Number: 6,001,669
[45] Date of Patent: *Dec. 14, 1999

[54] METHOD FOR PRODUCING II-VI COMPOUND SEMICONDUCTOR EPITAXIAL LAYERS HAVING LOW DEFECTS

[75] Inventors: James Matthew Gaines, Mohegan Lake; John Petruzzello, Carmel, both of N.Y.

[73] Assignee: Philips Electronics North America Corporation, New York, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 07/917,538

[22] Filed: Jul. 21, 1992

Related U.S. Application Data

[63] Continuation of application No. 07/758,985, Sep. 9, 1991, abandoned.

[51] Int. Cl.$^6$ .......................... C30B 29/46; C30B 29/48; H01L 21/06; H01L 21/20
[52] U.S. Cl. .......................... 438/102; 117/106; 117/956; 438/46; 438/84; 438/95
[58] Field of Search .................................... 437/105, 108, 437/111, 127, 129; 148/DIG. 64; 156/600, 610, DIG. 72, DIG. 77, DIG. 103; 438/758, 478, 974, 102, 95, 84, 46; 117/106, 108, 956

[56] References Cited

U.S. PATENT DOCUMENTS 4,876,218  10/1989  Pessa et al. .............................. 437/107

OTHER PUBLICATIONS

Yao et al., "Fabrication of ZnS/(ZnSe) n/ZnS Single Quantum Well Structures and Photoluminescence Properties", J. Cryst. Growth, III, May 1991, pp. 823–828.

Ramesh et al, "High Quality ZnSe/GaAs Superlattices: MEE Growth, and Structural and Optical Characterization," J. Crystal Growth, III, May 1991, pp. 752–756.

Ren et al. Blue (ZnSe) and Green ($ZnSe_{0.9}Te_{0.1}$) Light Emitting Diodes, J. Crystal. Growth, III, May 1991, pp. 829–832.

Briones et al., "Atomic Layer Molecular Beam Epitaxy (ALMBE):Growth Kinetics and Applications", J. Crystal. Growth, III, May 1991, pp. 194–199.

Yamaga et al., "Atomic Layer Epitaxy of ZnS by a New Gas Supplying System in Low–Pressure Metalorganic Vapor Phase Epitaxy," J. Cryst. Growth, 117, 1992, pp. 152–155.

Gotoh et al., "Low–Temperature Growth of ZnSe—Based Pseudomorphic Structures by Hydrogen–Radical–Enhanced Chemical Vapor Deposition", J. Crystal Growth, 117, 1992, pp. 85–90.

Konagai, "Wide Bandgap II–VI Compounds Grown by MOMBE", J. Crystal Growth, 120, 1992, pp. 261–268.

Kimura et al, "Atomic Layer Epitaxy of ZnSe on GaAs (100) by Metalorganic Molecular Beam Epitaxy," J. Cryst. Growth 116, 1992, pp. 283–288.

Ramesh et al., "Study of High Quality ZnSe/GaAs/ZnSe Single Quantum Welland ZnSe/GaAs Heterostructures", J. Cryst. Growth, 115, Dec. 1991, pp. 333–337.

(List continued on next page.)

*Primary Examiner*—Mary Wilczewski
*Attorney, Agent, or Firm*—John C. Fox

[57] ABSTRACT

Epitaxial layers of II–VI semiconductor compounds having low incidence of lattice defects such as stacking faults are produced by first depositing a fraction of a monolayer of the cation species of the compound, followed by depositing a thin layer of the compound by migration enhanced epitaxy (MEE). Growth of the remainder of the layer by MBE results in much lower defects than if the entire layer had been grown by MBE. Layers are useful in devices such as LEDs and injection lasers.

14 Claims, 5 Drawing Sheets

OTHER PUBLICATIONS

Lee et al., "Growth of ZnSe on (100) GaAs by Atomic Layer Epitaxy", J. Cryst. Growth, 117, 1992, pp. 148–151.

Salokatve et al, "Reductoion of Surface Defects in GaAs Grown by Molecular Beam Epitaxy", Appl. Phys. Lett. 51, No. 17, Oct. 26, 1987, pp. 1340–1342.

Yao et al. "Photoluminescence Properties of ZnSe Single Crystalline Films Grown by Atomic Layer Epitaxy", Appl. Phys. Lett., 48, No. 23, Jun. 9, 1986, pp. 1615–1616.

Lilja et al., "A Comparative Study of Growth of ZnSe Films on GaAs by Conventional Molecular—Beam Epitaxy and Migration Enhanced Epitaxy", J. Vac. Sci Technol. B, vol. 7, No. 4, Jul./Aug. 1989, pp. 593–598.

METHOD FOR PRODUCING II-VI COMPOUND SEMICONDUCTOR EPITAXIAL LAYERS HAVING LOW DEFECTS

This is a continuation of application Ser. No. 07/758,985, filed Sep. 9, 1991, now abandoned.

BACKGROUND OF THE INVENTION

The present invention relates generally to II–VI compound semiconductor epitaxial layers such as ZnSe and Zn ($S_x Se_{l-x}$) having a low incidence of lattice defects, and also relates to a method for producing such layers and to devices utilizing such layers, for example, light emitting diodes and semiconductor injection lasers.

There is a continuous push toward higher data densities on optical discs. In particular, for digital storage of video data, a substantial increase over the presently attainable densities must be achieved. The information density on optical discs is largely limited by the bit size, which is in turn determined by the wavelength of the laser used to read and write the data. Current optical disc systems use infrared emitting III–V compound semiconductor lasers operating in the wavelength range of 800 to 850 nm. Decreasing the wavelength by a factor of 2, by using blue lasers operating at half the wavelength of presently used III–V lasers, could halve the laser spot diameter and therefore allow a four-fold increase in the information density. ZnSe is the most promising material so far for producing practical blue emitting semiconductor injection lasers. Such lasers emit at a wavelength near 460 nm.

As shown in FIG. 1a, a basic laser structure 10, the so-called double heterojunction semiconductor injection laser, contains an active layer 17 sandwiched between two cladding layers 15 and 19 of a wider bandgap material. Laser action takes place in the active region where electrons and holes recombine to generate coherent light. Electrons flow from the n-type cladding layer into the conduction band of the active layer. Holes flow from the p-type cladding layer into the valence band of the active layer. This process is illustrated in the energy band diagram of FIG. 1b. As is known, electrons and holes can be injected electrically where the cladding layers are doped n-type and p-type, or can be injected by optical or electron beam pumping, in which cases it is not necessary for the layers to be doped.

The cladding layers must have a bandgap higher than that of the active layer to assure effective injection of electrons and holes, and to minimize the threshold for laser action. The cladding layers also have a lower index of refraction. Therefore, the light generated is confined to the active layer, which guides the light in an intended direction, and also helps to minimize the laser threshold.

The bandgap of the semiconductor in the active layer determines the wavelength of the light generated. The II–VI semiconductors ZnSe and ZnS have relatively wide bandgap energies of 2.7 and 3.7 ev, respectively, and are therefore suitable materials for building short wavelength blue lasers. However, lattice defects in these and other laser materials, particularly stacking faults and threading dislocations, are known to adversely affect the operation of these semiconductor lasers, and it has been found to be difficult in practice to obtain epitaxial layers of the II–VI compounds with an acceptably low incidence of lattice defects by conventional deposition techniques such as molecular beam epitaxy (herein "MBE").

OBJECTS AND SUMMARY OF THE INVENTION

Accordingly, it is one of the objects of the invention to provide epitaxial layers of II–VI semiconductor compounds having a low incidence of lattice defects, particularly stacking faults and threading dislocations.

It is another object of the invention to incorporate such low defect layers into useful devices such as light emitting diodes and semiconductor injection lasers.

It is still another object of the invention to provide a method for producing such low defect epitaxial layers and devices.

In accordance with the invention, it has been discovered that defect densities in a II–VI semiconductor compound epitaxial layer can be kept quite low by employing migration enhanced epitaxy (herein "MEE") to deposit at least the first several atomic monolayers, and by preceding such deposition with exposure of the substrate to the cation species of the semiconductor compound to be epitaxially grown, resulting in the deposition of less than a monolayer of the cation species on the substrate.

As is known, migration enhanced epitaxy or MEE involves alternately depositing on a substrate suitable for epitaxial growth (herein "epitaxial substrate"), layers of the cation and anion species of the semiconductor compound to be formed. In accordance with the invention, when such alternate depositions are made under conditions to result in up to a monolayer during each deposition, greater mobility of the atoms on the surface results, creating a smoother surface with fewer defects. Deposition of more than a monolayer results in non-uniform distribution of the species on the surface, which hinders the formation of a single crystalline material. The depositions are a self-limiting process, depending on temperature. For example, at 200° C., about 0.8 monolayer sticks per period, regardless of the length of time the shutters are opened (beyond the time required for deposition of 0.8 monolayer).

Continuing growth of the layer by MBE on top of the MEE layer results in a much lower defect density than if the layer had been grown by MBE directly on the epitaxial substrate. For example, stacking fault density can be reduced by more than four orders of magnitude.

For the growth of ZnSe, for example, MEE simply means that the substrate is exposed to Zn for a short time (3 seconds was a typical deposition time in this case), and then it is exposed to Se for a short time. A pause between depositions may be needed to allow complete closing of one shutter before the next shutter opens. Typically, pauses of 1 second or less between depositions are sufficient. A "period" as used herein refers to one deposition of cation species plus one deposition of anion species, together with the associated pauses between depositions. This type of growth (MEE) is to be contrasted with conventional MBE growth, where both the cation and anion fluxes would be incident on the substrate simultaneously.

At least 20 periods of such growth, and preferably about 50 periods, resulting in a thickness of about 100 angstroms of the MEE layer, have been found to result in a surface sufficient to support the subsequent growth of a low defect layer by MBE on the MEE-produced layer.

Also in accordance with the invention, the MEE deposition is preceded by depositing less than a monolayer of the cation species of the semiconductor compound to be formed.

For example, where the compound is Zn ($S_x Se_{l-x}$ less than a monolayer of Zn is deposited initially on the substrate, for example, by exposing the substrate to zinc vapor at a temperature within the range of about 200 to 500° C. for up to a minute. This is a self-limiting process in that the cation species will no longer adhere to the substrate after the fraction of a monolayer is deposited. It is speculated that the effectiveness of this initial deposition is at least partly due to the tying-up of residual oxygen on the surface of the substrate, such oxygen being present as a result of incomplete removal during conventional surface preparation of the substrate, for example, degreasing followed by a deoxidizing bake at about 600° C. (The temperature is not particularly important, since it is standard practice to observe the oxide desorption directly by electron diffraction.)

Following the deposition of the initial layer of the cation species, deposition of the MEE layer takes place, typically at a temperature within the range of about 150 to 400° C. for from 1 to several seconds, below which temperature range significantly more than a monolayer results, and above which temperature range deposition of the species is negligible. Preferably, about ¾ of a monolayer is deposited during each period. In the case of ZnSe, about ¾ of the monolayer is obtained during a 2½ second period of deposition at a temperature of about 200° C.

Since MBE exposes the substrate to both the cation and anion species simultaneously, which is considerably simpler and less time consuming than MEE, continuation of growth by MBE preferably takes place as soon as a layer of sufficient thickness to limit defect formation has been created by MEE.

In the case of ZnSe, MBE is typically carried out at a temperature within the range of about 250 to 350° C. The lower limit of 250° C. is higher than the lower limit for MEE in order to provide the needed mobility for the species (and therefor good crystalline quality of the resulting layer), the mobility of the species at a given temperature being lower in the case of MBE.

In view of the above discussion, it will be understood that the term "layer" as used herein can include less than an atomic monolayer of a species, and that the term "epitaxial layer" includes not only such a single fraction of a monolayer, but also subsequent layers produced by MEE and optionally MBE. In addition, as will be further explained herein, the MEE and MBE layers within a single epitaxial layer according to the invention need not have the same composition. For example, where the II–VI semiconductor compound is $Zn(S_x Se_{l-x})$, the value of x may vary from one layer to the next. Where the object is to produce an epitaxial layer comprising mainly $Zn(S_xSe_{l-x})$ for example, as the cladding layer of a heterostructure laser having a ZnS active layer, it is inconvenient to form the MEE layer of $Zn(S_xSe_{l-x})$ since it is difficult in practice to provide sulphur as a separate source for deposition. Thus, it will be found more convenient to form the MEE layer of ZnSe, and to subsequently form the $Zn(S_xSe_{l-x})$ layer by conventional MBE in which the sulphur is provided by zinc sulfide vapor. As is known, the temperature of the ZnS source will depend on the desired sulfur content of the layer.

DESCRIPTION OF THE PREFERRED EMBODIMENTS

Figure 1A:
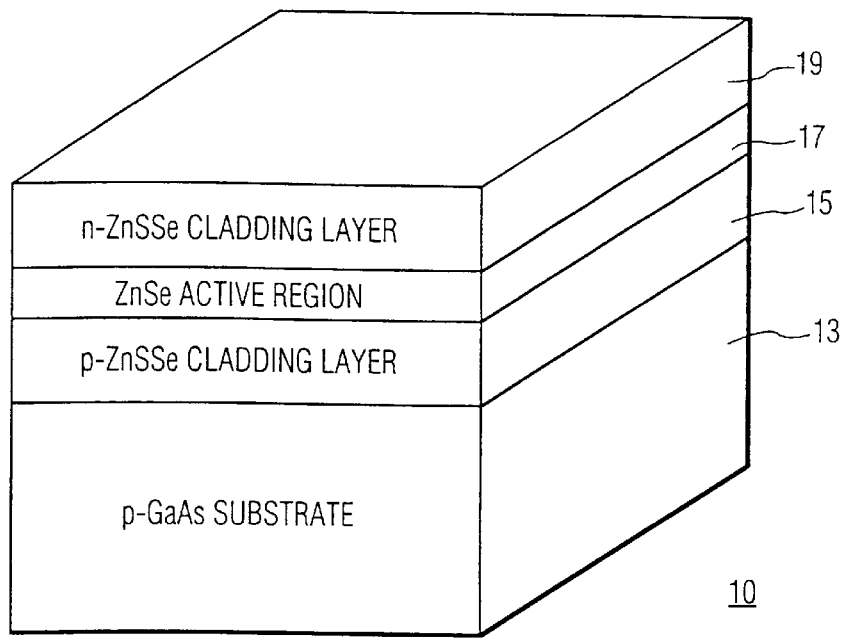
FIG. 1(a) is a cross-section of a double heterojunction injection laser of the prior art.
Figure 1B:
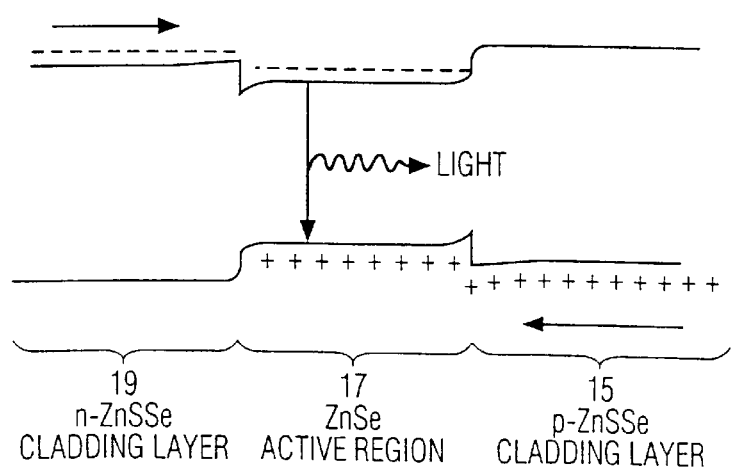
FIG. 1(b) is an energy band diagram for operation of the laser of FIG. 1(a)

MEE is a modification of the MBE technique, and occurs when the growing surface is alternately exposed to beams of cation and anion species. The method is similar to atomic layer epitaxy (ALE) but without the requirement of growing exactly one monolayer per deposition period. Exposure of the surface to one element at a time allows for increased surface migration and attachment at stable sites to produce high quality films. The films grown by MEE are not only of higher structural quality than those grown by MBE but also show a slower relaxation rate of the misfit strain. The quality of the MEE growths are dependent on whether the initial exposure of the substrate was to the cation or to the anion species.

Experimental

All growths were done in a Varian GEN II MBE system. Ex-situ characterization techniques include transmission electron microscopy (TEM) and X-ray diffraction (XRD). In-situ characterization techniques include reflection high-energy electron diffraction (RHEED), and X-ray photoelectron spectroscopy (XPS). The preparation chamber has XPS, Auger and ion milling capabilities. Both CrO-doped and Zn-doped GaAs substrates were used. MEE growths described here were done at an indicated substrate temperature of 200° C. Zn and Se fluxes of $0.9 \times 10^{-6}$ and $1.8 \times 10^{-6}$ Torr were used. Under standard MBE growth conditions (both fluxes incident continuously), these fluxes yield a growth rate of approximately 1 $\mu$m/hour. Before MEE growth, the substrate was exposed to either the Zn or Se flux for about 30 seconds, at either 200° C. or 500° C. During growth, deposition times for Zn and Se were about 2.5 seconds. Delays of 0.2–0.3 seconds were added between depositions to insure that one shutter closed completely before the next opened. The growth rate extracted from the measured thicknesses is about 0.8 monolayers/period, where a period refers to one deposition of Zn plus one deposition of Se (plus delays) and the monolayer thickness equals the distance between two successive (001) Zn planes.

Epitaxial layers of ZnSe varying in thickness from 900 to 5000 Å were grown by MEE. One layer was grown to a thickness of 1 $\mu$m by first growing a 1000 Å Zn-started MEE layer, followed by a 9000 Å MBE-grown layer.

Several MBE growths were done for comparison to the MEE-grown films. Of these, some were started with an initial exposure of the substrate to either a Zn or a Se flux for about 30 seconds. Other growths were started by simultaneously opening both (Zn and Se) shutters. Growth temperatures used for MBE were typically 100° C. higher than for MEE growths.

Both conventional planar and cross-section samples were prepared for the TEM measurements. Samples were mechanically polished to thickness of about 50 $\mu$m. The planar samples were perforated using a Br-methanol etch while the cross-section samples were ion milled. All microscopy was performed with a Philips EM430 operating at 300 kV.

X-ray (004) rocking curves were obtained using the high resolution Biaxial diffractometer with a monochromator consisting of two channel-cut Ge (220) crystals in the +--+ configuration. For all samples, data were collected at four or more azimuthal settings.

Results (1.) Zn Started Growth

Figure 2:
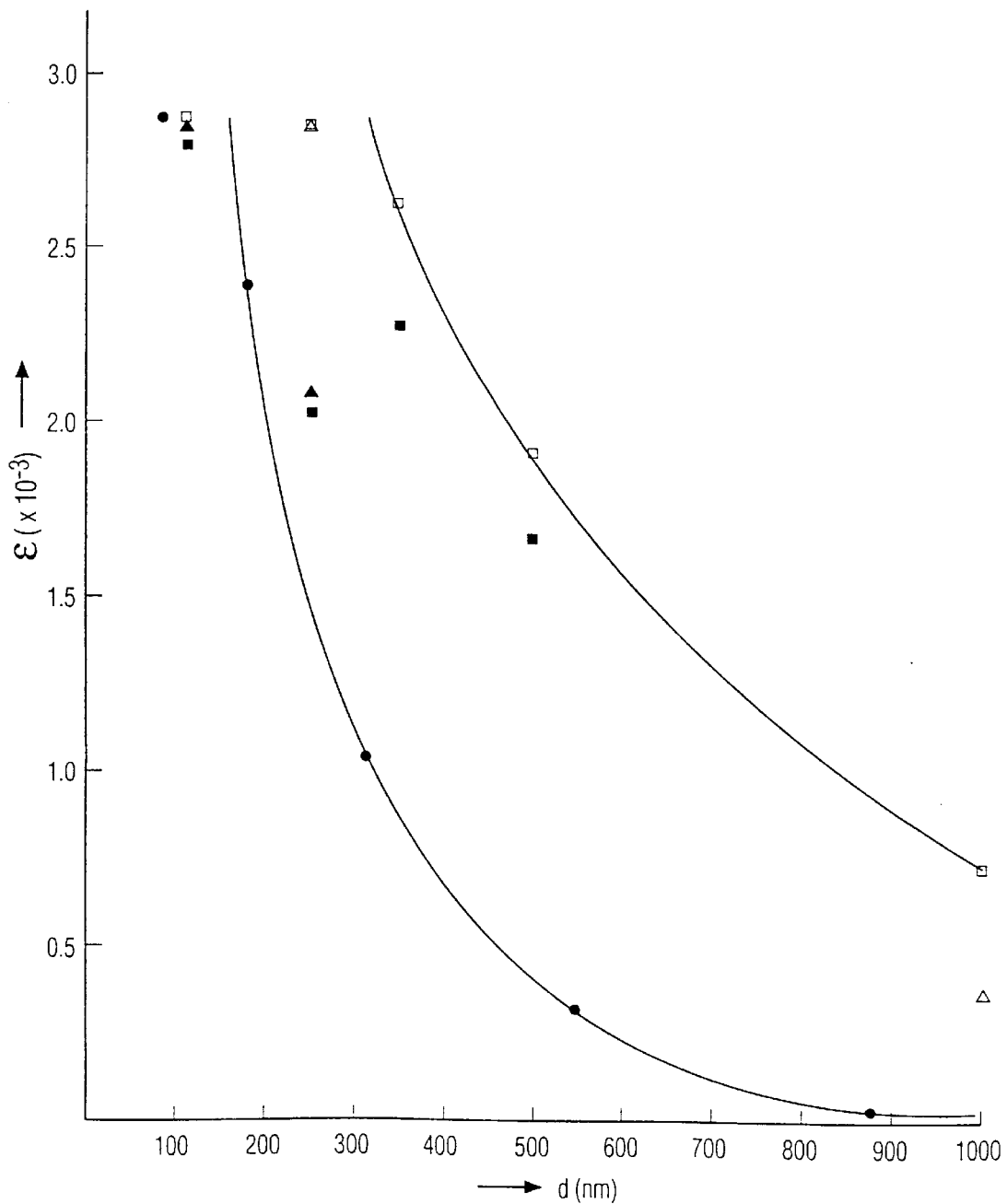
FIG. 2 is a graph of strain Σ versus layer thickness d for MBE and MEE-grown ZnSe epitaxial layers.

The structural quality of the MEE-grown films of ZnSe is highest when the substrate is first exposed to a Zn flux. Bright field planar views of several samples are shown in FIG. 2. Defect densities showed no dependence on substrate temperature during the Zn deposition. The only defects found in the thin pseudomorphic Zn-started films are stacking faults at a density of $<10^4$ cm$^{-2}$. These stacking faults emanate from the substrate-film interface and traverse the film thickness to the surface. They have a habit plane of (111) and are bounded by partial dislocations along [110]'s that are 60°, to one another. The faults can be alone or grouped with one, two or three other fault planes around the same point in the interface. In a case where all four (111) planes contain faults around a "defect site" at the interface, the fault planes formed a pyramid, with one apex at the substrate-film interface. A low density of misfit dislocations (60°type) begins to appear when the Zn-started films reach a thickness of about 2500 Å. However, very little strain (<2%) is relieved by the misfit dislocations because their average separation is about 4 μm. In contrast, the known critical thickness (for MBE-grown ZnSe) is 1500 Å. There were no observations of threading dislocation segments into the 2500 Å film. For thicker films, misfit dislocation densities increase with increasing layer thickness, but relaxation is considerably less than for MBE-grown films of comparable thickness. Threading dislocation densities remain low as thickness increases. The 1 μm-thick film where only the first 1000 Å were grown by MEE also was less relaxed than equal-thickness films grown entirely by MBE. The amount of in-plane misfit strain is indicated for all films in FIG. 2.

X-ray (004) rocking curves were measured on the MEE-grown, Zn-started 1000 and 2500 Å samples. Each sample was rotated 45° about its normal, the [001], between each of eight successive measurements, to check for any dependence of the rocking curve on the azimuthal setting. The Table given below summarizes the data obtained. The pseudomorphic nature and high structural quality of the 1100 Å film is indicated by the in-plane lattice constant, $a_\parallel$ of the ZnSe being nearly equal to that of GaAs, the parallel alignment of the ZnSe and GaAs (004) planes (even though the surface plane is inclined to the (004) by 0.15°) and the excellent agreement of the experimental rocking curve to that expected from a perfect pseudomorphic 1100 Å ZnSe film. This sample has a measured FWHM (full width at half maximum) of 154±4" which corresponds to the width expected from a perfect film of thickness 1090±30Å. Cross sectional TEM measurement yields a thickness of 1070±20Å. The (004)'s of the GaAs and ZnSe are parallel to within 0.0017° and $\theta_{GaAs}-\theta_{ZnSe}=0.220\pm15°$. This yields a ZnSe in plane lattice constant of 5.6537 Å (if the following data are used: $\lambda_{CuK\alpha}=1.540595$ Å; and at 20° C.: $a_{ZnSe}=5.66905$ Å, $a_{GaAs}-5.6536$ Å and $(2*c12/c11)_{ZnSe}=1.206$).

TABLE

| Sample | Nominal Thickness (μm) | Initial Deposition | $T_{initial}$ (°C.) | FWHM$_{ZnSe}$ (") | FWHM$_{GaAs}$ (") | Tilt (°) | Å |
|---|---|---|---|---|---|---|---|
| a | 1100 | Zn | 200 | 154(4) | 14.1 | <.0015 | 5.6875 |
| b | 1100 | Se | 200 | 164(3) | 14.6 | <.0020 | 5.6874 |
| c | 900 | Zn | 500 | 202(1) | 14.9 | <.0016 | 5.6877 |
| d | 900 | Se | 500 | 227(3) | 14.8 | <.0008 | 5.6878 |
| e | 2500 | Zn | 200 | 70.7(1.4) | 14.6 | <.0017 | 5.6877 |
| f | 2500 | Se | 500 | 352(23) | 16.3 | <.0033 | 5.6840 |
| g | 5000 | Zn | 200 | 430(27) | 21.5 | .011 | 5.6789 |
| h | 5000 | Se | 200 | 408(17) | 20.8 | .007 | 5.6781 |

The 900 Å film, in which the Zn initial deposition was done at 500° C. is of relatively high structural quality. Its rocking curve width is 202" as compared to a calculated width of about 185" for a 900 Å film. Thus, the higher substrate temperature during the initial Zn deposition results in some peak broadening, although the TEM measurements show no greater defect density.

In case of a Zn-started 2500 Å film, the ZnSe (004) has a FWHM of 70.7±1.4", lies within 0.0017° of the GaAs (004) and has an in-plane lattice constant of 5.6537(2) Å. Based on the experimental FWHM and interference fringe period, its thickness is determined to be 2525±50 Å as compared to a TEM measurement of 2420±20 Å. The data show that this film is also of high structural quality and close to being completely pseudomorphic. The only indication that the film is other than a perfect single crystal is some weak scattering between the ZnSe and GaAs (004) peaks at a position corresponding to fully relaxed ZnSe. This is only seen in rocking curves at particular azimuthal settings. For this growth, TEM measurements revealed occasional localized regions containing a high density of dislocations that may have caused this weak peak. We also observe such regions in conventional MBE-grown and MOVCD-grown ZnSe films and similar peaks have been observed in $ZnS_xSe_{1-x}$. We speculate that these defects are caused by substrate preparation.

(2.) Comparison of Zn- and Se-started Growth

There is a distinct difference in the quality of MEE-grown ZnSe films when a pre-growth treatment with Se is done. The substrate temperature at the beginning of Se exposure has a large effect on defects in the resulting layer. If exposure begins at the growth temperature (200° C.) then Se-started films are slightly more relaxed than their Zn-started counterparts. If exposure to Se begins at higher substrate temperatures (500 C.), then significantly more defects are observed in the resulting films. Thinner films show stacking fault densities of >$10^8$ cm$^{-2}$ (more than four orders of magnitude greater than equivalent Zn-started growths). Misfit dislocation densities are increased and much greater relaxation is observed in these films. The 2500 Å film has relaxed nearly as much as equivalent MBE-grown films. Unlike the Zn-started films, many of the misfit dislocations observed in the Se films are terminated by threading dislocations that extend from the interface to the surface of the film.

In case of the 1100 and 2500 Å Se-started films, the Se depositions were started at 200° C. for the 1100 Å film and at 500° C. for the 2500 Å film. The films appear quite different from each other and also differ significantly from the Zn-started films. In general, they indicate films of lower structural perfection than the Zn-started films. The Sc-started 1100 Å film has a FWHM which is about 6% broader than the comparably thick Zn-started film. The 2500 Å Se-started film has a rocking curve that is quite different from the 1100 Å Se-started film. The ZnSe peak is anisotropic and has a FWHM that is 500% broader than that of the 2500 Å Zn-started film. The average in-plane lattice constant of 5.6566 Å indicates that the film is partially relaxed, in agreement with the array of misfit dislocations observed at the interface by TEM.

(3.) MBE Growth

MBE films, grown to a thickness of 1100 Å, contain defects of a type that also depend upon the initial deposition. An initial deposition of Zn results in a high density of dislocation loops. An initial deposition of Se results in a high density of stacking faults and dislocations. In either case, the density of defects is much higher than that observed for the MEE-grown films. In addition, higher magnification TEM reveals the presence of small voids of a tubular shape at the GaAs/ZnSe interfaces of MBE-grown films. Voids were observed in MBE-grown samples of thickness varying from 1100 Å to 4 μm, and were present regardless of the initial deposition conditions. The density of these voids is approximately $5\times10^9$ cm$^{-2}$. Their height and diameter are approximately 1000 Å and 50 Å, respectively. Such voids were not observed in the MEE-grown films.

(4.) Comparison of MEE and MBE Growth

FIG. 2 compares the strain Σ measured by TEM ■, □ and X-ray diffraction ▲, Δ for MEE-grown layers with the strain measured for typical MBE-grown layers. The data for MBE layers was taken from Petruzello et al, Appl. Phys. Lett., 63 (7), 2299 (1988). Clearly, the relaxation of layers grown by MEE ▲, Δ is significantly less than for equal-thickness layers grown by MBE, even when the growth is only started with MEE and completed with MBE. The relaxation of Se-started samples (▲, ■) is slightly greater than that of Zn-started samples (Δ, □), if the initial Se deposition is done at the growth temperature. The relaxation is much greater than the Zn-started samples if the initial Se deposition begins at 500° C.

Figure 3:
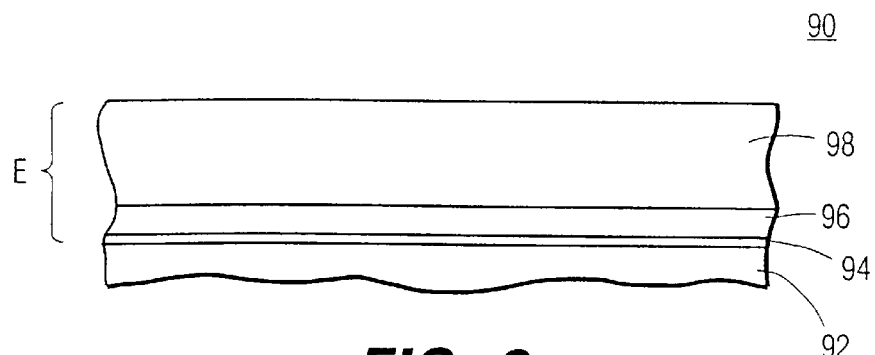
FIG. 3 is a cross-section of an epitaxial layer of $Zn(S_xSe_{l-x})$ in accordance with the invention.

FIG. 3 shows an epitaxial layer of the invention 90 comprising an initial fractional monolayer 94 of the cation species of the semiconductor compound on the substrate 92, a thin MEE-deposited layer of the compound on the initial layer 94, and a thick MBE-deposited layer 98 on the MEE deposited layer 96. These three separate layers 94, 96 and 98 together form the single epitaxial layer E. Typically, substrate 92 would be GaAs, layer 94 would be Zn, layer 96 would comprise $Zn(S_xSe_{1-x})$ where x is zero, and layer 98 would comprise $Zn(S_xSe_{1-x})$ where x has a positive value.

Figure 4:
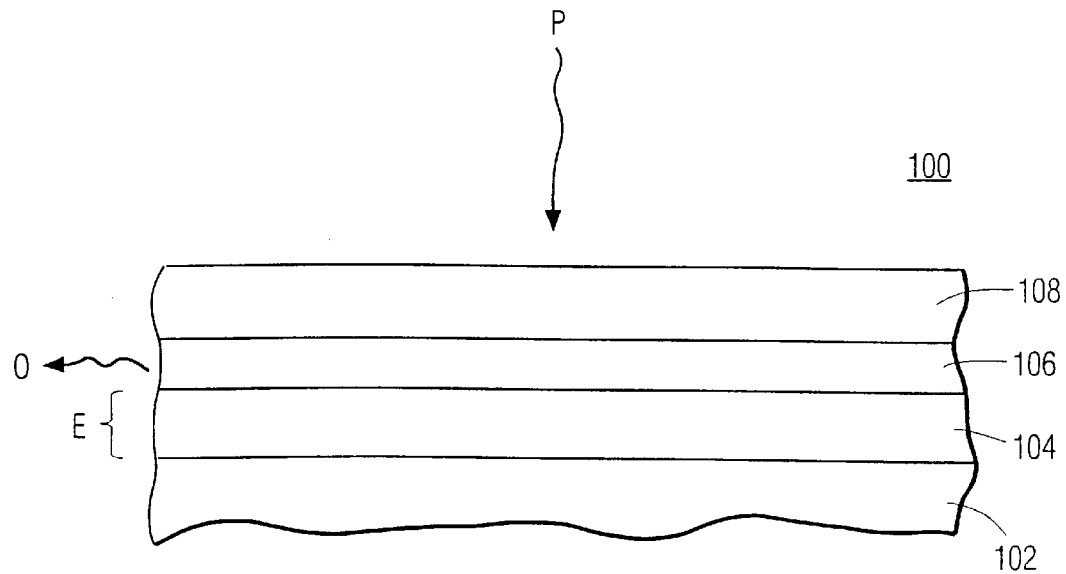
FIG. 4 is a cross-section of a double heterojunction injection laser of the invention, incorporating the epitaxial layer of FIG. 3 as a first cladding layer.

FIG. 4 shows a double heterojunction injection laser 100, including a first cladding layer 104 on a substrate 102, this cladding layer being an epitaxial layer E of the type shown in FIG. 3, an active layer 106 and a second cladding layer 108. In the embodiment shown in FIG. 4, the laser is optically pumped, as indicated by arrow P, resulting in a laser output, as indicated by arrow O, from the active region 106.

Figure 5:
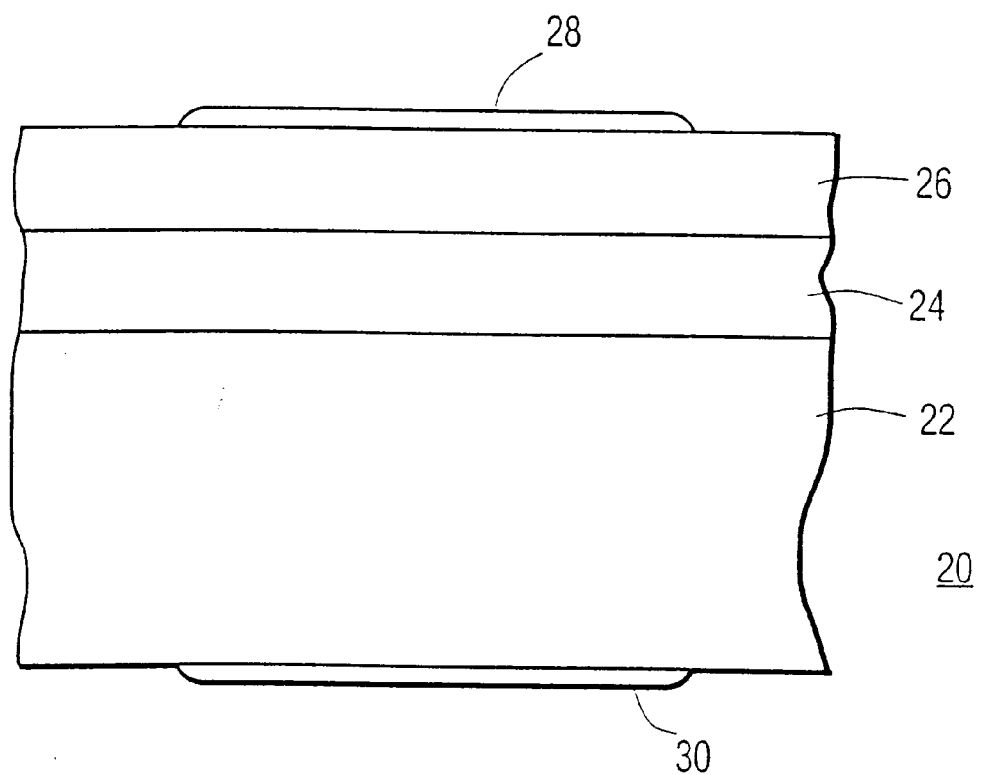
FIG. 5 is a graph plotting output intensity versus optical pump intensity of the laser of FIG. 9, for two different active layer thicknesses.

FIG. 5 is a graph plotting output intensity $I_o$ in arbitrary units of such a heterojunction laser versus optical pump intensity $I_p$ in kilowatts per square centimeter (kWcm$^{-2}$) for two different active layer thicknesses of 750 (curve A) and 1500 Å (curve B) respectively and measured at room temperature. For an active layer of ZnSe and cladding layers of $ZnS_xSe_{1-x}$ where x is 0.06, the wavelength of the optical pump was 4400 Å, while the wavelength of the laser output was 4650 Å, resulting in a visible emission in the blue region of the spectrum.

Figure 6:
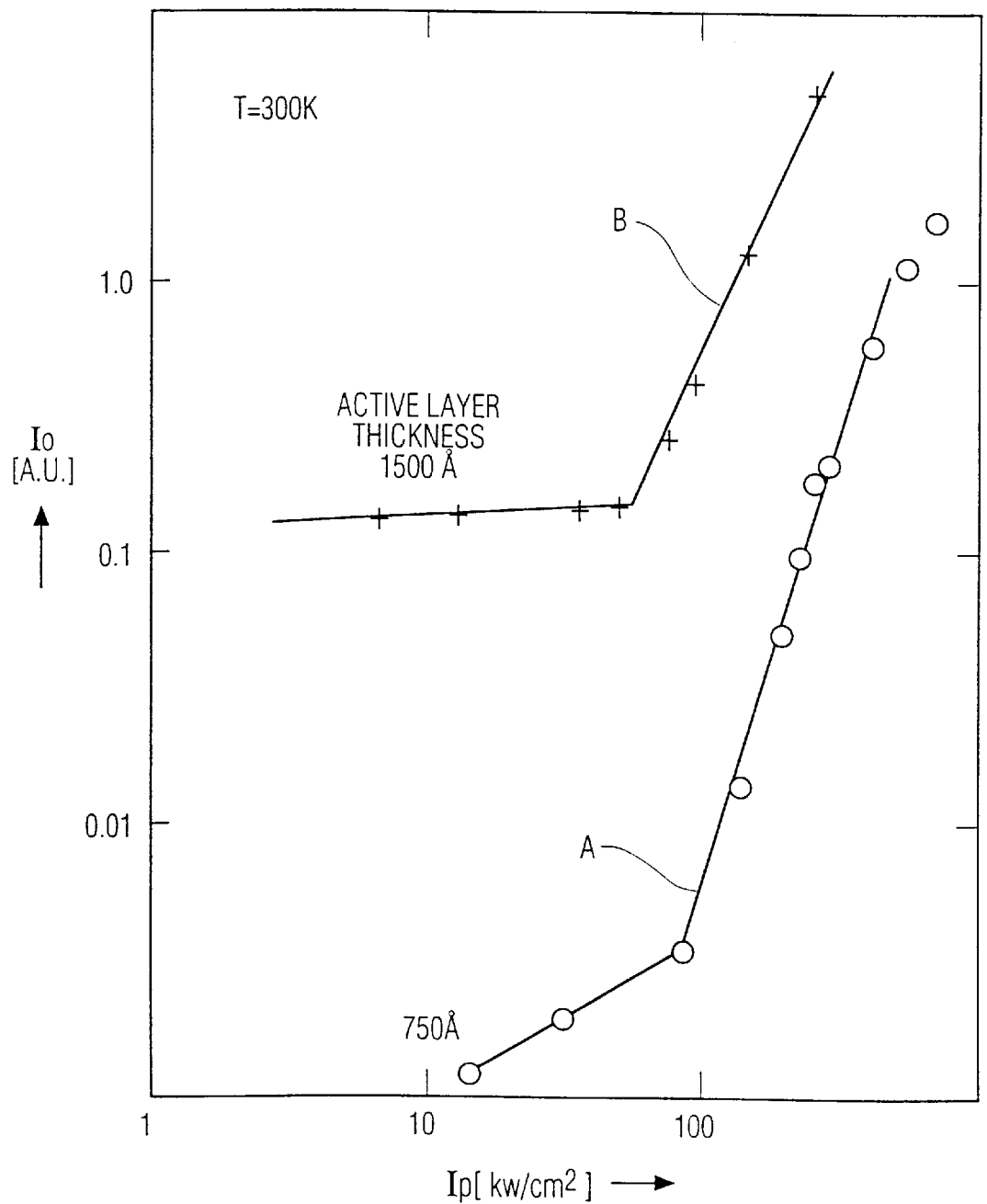
FIG. 6 is a cross-section of a light emitting diode of the invention incorporating the epitaxial layer of FIG. 8 as a first layer.

FIG. 6 is a cross section of a light emitting diode 20 including a p-type layer 24 of, for example, ZnSe on a substrate 22 of, for example, GaAs, and an n-type layer 26 of, for example, ZnSe on layer 24, completed with electrodes 28 and 30 on the upper and lower surfaces of the diode, respectively. In accordance with the invention, layer 24 is a low defect epitaxial layer of the type shown in FIG. 4, for example.

The invention has been described in terms of a limited number of embodiments. Other embodiments, and variations thereof, will become apparent to those skilled in the art, and as such are intended to be encompassed within the scope of the invention as defined by the appended claims.

We claim:

1. Method for producing an epitaxial layer of a II–VI semiconductor compound comprising a cation and an anion species on an epitaxial substrate, the method comprising the steps of:
   (a) cleaning the surface of the epitaxial substrate;
   (b) depositing an initial layer of the cation species of the compound directly on the cleaned surface of the epitaxial substrate;
   (c) depositing at least a first portion of the epitaxial layer by MEE directly on the initial cation layer, wherein MEE comprises at least two consecutive periods of alternative deposition of the cation and anion species of the compound.

2. The method of claim 1 in which a second portion of the epitaxial layer is deposited by MBE directly on the MEE layer.

3. The method of claim 2 in which the MBE deposition is carried out at a temperature within the range of about 250 to 400 degrees C.

4. The method of claim 2 in which MEE comprises at least twenty consecutive periods of alternative deposition of the cation and anion species of the compound prior to MBE growth.

5. The method of claim 4 in which MEE comprises at least fifty consecutive periods of alternative deposition of the cation and anion species of the compound prior to MBE growth.

6. The method of claim 1 in which the cation is Zn.

7. The method of claim 6 in which the initial layer is deposited at a temperature within the range of about 200 to 500 degrees C.

8. The method of claim 1 in which the compound comprises Zn(SxSe1-x), where x has a value of from zero to 1.0.

9. The method of claim 8 in which the MEE deposition is carried out at a temperature within the range of about 150 to 400 degrees C.

10. The method of claim 1 in which the substrate comprises GaAs.

11. The method of claim 1 in which less than a monolayer of the initial layer is deposited.

12. The method of claim 1 in which less than a monolayer is deposited during each period of the MEE deposition.

13. The method of claim 1 in which cleaning comprises a deoxidizing bake.

14. The method of claim 13 in which the deoxidizing bake is preceeded by degreasing.

* * * * *